US010373834B2

(12) United States Patent
Huang

(10) Patent No.: US 10,373,834 B2
(45) Date of Patent: Aug. 6, 2019

(54) METHOD FOR MANUFACTURING A METAL GATE

(71) Applicant: Shanghai Huali Microelectronics Corporation, Shanghai (CN)

(72) Inventor: Qiuming Huang, Shanghai (CN)

(73) Assignee: Shaghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 15/944,800

(22) Filed: Apr. 4, 2018

(65) Prior Publication Data
US 2019/0189451 A1 Jun. 20, 2019

(30) Foreign Application Priority Data

Dec. 20, 2017 (CN) .......................... 2017 1 1386290

(51) Int. Cl.
H01L 29/66 (2006.01)
H01L 21/28 (2006.01)
H01L 29/40 (2006.01)
H01L 29/423 (2006.01)
H01L 29/78 (2006.01)

(52) U.S. Cl.
CPC ...... H01L 21/28114 (2013.01); H01L 29/401 (2013.01); H01L 29/42376 (2013.01); H01L 29/66545 (2013.01); H01L 29/6659 (2013.01); H01L 29/7833 (2013.01)

(58) Field of Classification Search
CPC ......... H01L 29/66545; H01L 29/66553; H01L 29/66575; H01L 29/6659; H01L 29/7833
See application file for complete search history.

(56) References Cited

U.S. PATENT DOCUMENTS

2014/0179093 A1* 6/2014 Choi ................. H01L 21/28088
438/589

* cited by examiner

Primary Examiner — Hoai V Pham
(74) Attorney, Agent, or Firm — Kilpatrick Townsend & Stockton LLP

(57) ABSTRACT

The present disclosure provides a semiconductor structure of a metal gate and a manufacturing method therefor. The manufacturing method includes providing a semiconductor substrate; uniformly depositing a first hard mask layer on the semiconductor substrate, corresponding to a region where the metal gate is located, patterning and etching the first hard mask layer to form a recess, forming a sloping sidewall on a sidewall of the recess, the sloping sidewall and an upper surface of the substrate forming a groove structure, with the size of an upper part of the groove structure being larger than that of a lower part thereof, and forming a metal gate in the groove structure; and removing the first hard mask layer.

4 Claims, 3 Drawing Sheets

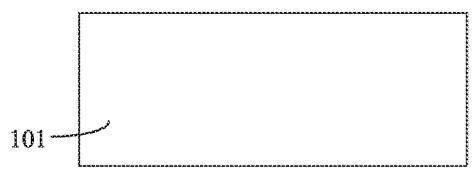
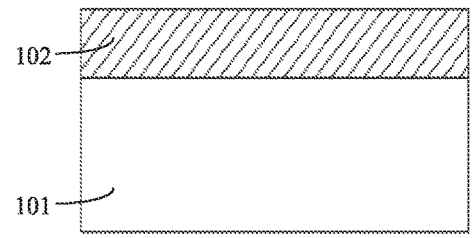
FIG 1A  FIG 1B
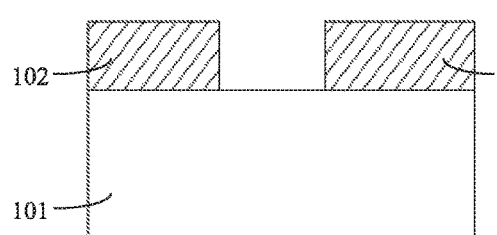
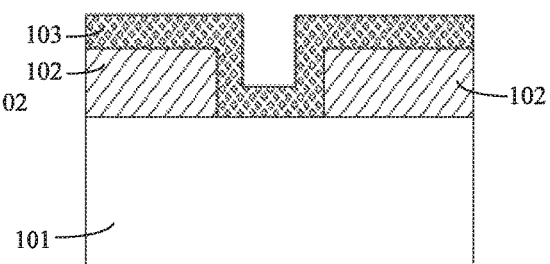
FIG 1C  FIG 1D
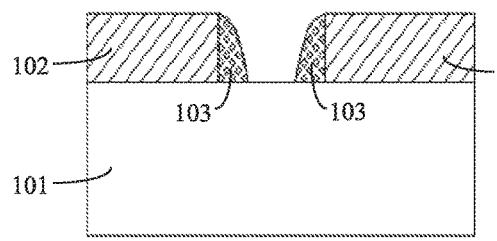
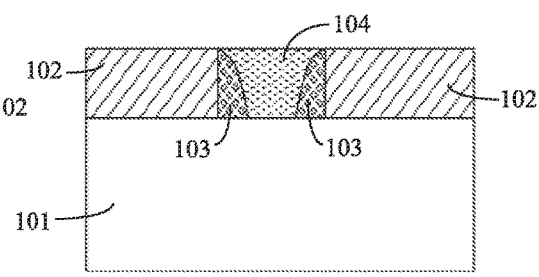
FIG 1E  FIG 1F
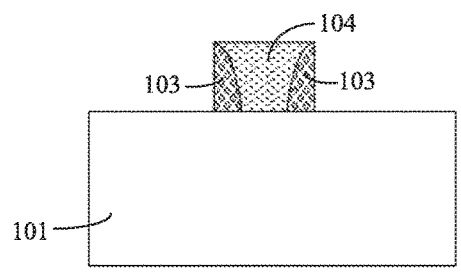
FIG 1G

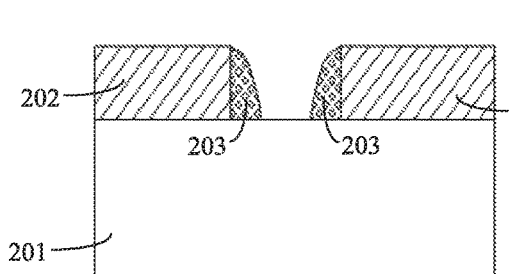
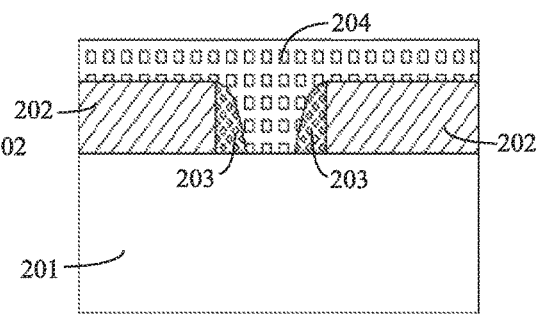
FIG 2A                FIG 2B
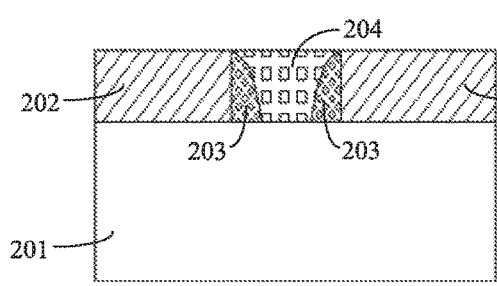
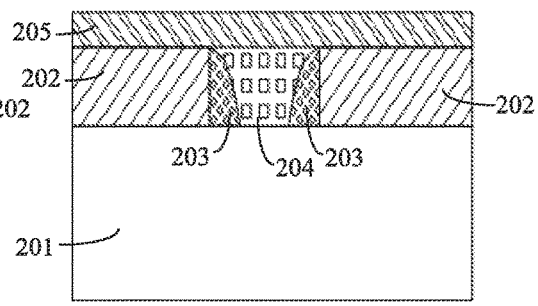
FIG 2C                FIG 2D
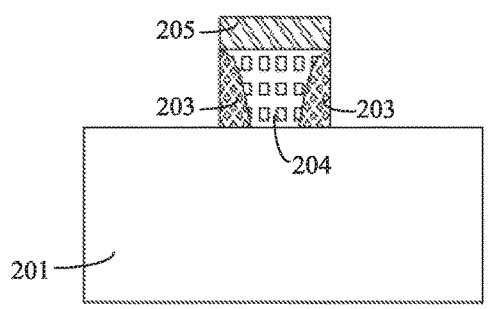
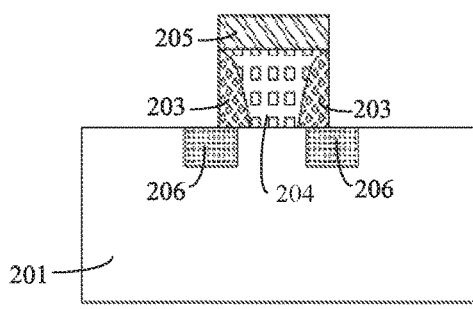
FIG 2E                FIG 2F

METHOD FOR MANUFACTURING A METAL GATE

CROSS-REFERENCES TO RELATED APPLICATIONS

The present application claims priority to Chinese Patent Application No. 201711386290.8, filed on Dec. 20, 2017, entitled "SEMICONDUCTOR STRUCTURE WITH METAL GATE, AND METHOD FOR MANUFACTURING THE SAME", which is incorporated by reference herein for all purposes.

TECHNICAL FIELD

The present disclosure relates to a semiconductor element and, in particular to a semiconductor structure of a metal gate, and method for manufacturing the same.

BACKGROUND

Since the invention of integrated circuits by Dr. Jack Kilby of Texas Instruments in early years, scientists and engineers have made numerous inventions and improvements in semiconductor devices and processes. In the past 50 years, the size of semiconductors has been significantly reduced, which leads to increasing processing speed and decreasing power consumption. To date, the development of semiconductors has largely followed Moore's Law, which roughly states that the number of transistors in dense integrated circuits doubles roughly every two years. Now, the semiconductor processes are being developed toward 20 nm or less, and some of the companies are embarking on the 14 nm process. Here, by way of providing only one reference, a silicon atom is about 0.2 nm, which means that the distance between two separate components manufactured by means of a 20 nm process is only about one hundred silicon atoms.

The manufacturing of semiconductor devices has therefore become increasingly challenging and advancing toward the physically possible limit. One of the recent developments in semiconductor technology has been the use of silicon germanium (SiGe) in semiconductor manufacturing. With the evolution of integrated circuit developments, functional densities (e.g., the number of interconnection line elements per chip area) are also generally increasing while the geometrical dimensions (i.e., the smallest element or line that can be produced using a process) are reduced. This size reduction process can often provide benefits in terms of increasing production efficiency and reducing associated costs; however, with the continuous development of integrated circuit manufacturing technology, MOS transistors are getting smaller and smaller in characteristic size. In order to reduce the parasitic capacitance at the gate of an MOS transistor, the speed of the device is increased and the gate stack structure of a high-K gate dielectric layer and a metal gate is introduced into the MOS transistor. In order to avoid the influence of the metal material of the metal gate on the other structures of the transistor, the gate stack structure of the metal gate and the high-K gate dielectric layer is usually fabricated by means of a "gate last" process.

The appearance of the metal gate can make the size of the MOSFET (Metallic Oxide Semiconductor Field Effect Transistor) very small, but correspondingly, while gradually reducing the volume of the MOSFET, in the process of forming the metal gate in the prior art, the metal is not easily deposited into a trench, voids are easily created, resulting in the performance degradation of the device.

Therefore, there is an urgent need for a semiconductor manufacturing method, which can well deposit a metal gate electrode, so that the interior of the prepared metal gate is less likely to form voids, so as to ensure the reliability of the metal gate and the good device performance of the semiconductor.

SUMMARY OF THE INVENTION

A brief summary on one or more aspects is given below to provide the basic understanding of these aspects. The summary is not an exhaustive overview for all the conceived aspects, and is intended to neither point out all the critical or decisive factors for all the aspects nor define the scope of any or all of the aspects. Its only aim is to provide some concepts of one or more aspects in a simplified manner as the preface of the more detailed description given later.

As described above, in order to solve the problem that in the prior art, since the metal is not easily deposited into the trench due to increasingly smaller critical dimensions, the voids are created and the performance of the device is degraded, the present disclosure provides a method for manufacturing a semiconductor structure of a metal gate includes providing a semiconductor substrate, uniformly depositing a first hard mask layer on the semiconductor substrate; corresponding to a region where the metal gate is located, patterning and etching the first hard mask layer to form a recess; forming a sloping sidewall on a sidewall of the recess, the sloping sidewall and an upper surface of the substrate forming a groove structure, with the size of an upper part of the groove structure being larger than that of a lower part thereof, and forming a metal gate in the groove structure; and removing the first hard mask layer.

In an embodiment of the manufacturing method, forming the sloping sidewall on the sidewall of the recess includes uniformly depositing a dielectric medium on an upper surface of the first hard mask layer and the sidewall and the bottom of the recess; etching the dielectric medium covering the upper surface of the first hard mask layer and the bottom of the recess, and reserving the dielectric medium covering the sidewall of the recess to form sloping sidewall.

In an embodiment of the manufacturing method, forming the metal gate further comprises: depositing a polysilicon layer on the upper surface of the first hard mask layer and in the groove structure; planarizing the polysilicon layer to remove polysilicon from the upper surface of the first hard mask layer to form a dummy gate in the groove structure; depositing a second hard mask layer on the upper surfaces of the first hard mask layer and the dummy gate; corresponding to a region outside the side wall and the dummy gate, patterning and etching the second hard mask layer and the first hard mask layer, and reserving the sidewall, the dummy gate and the second hard mask layer covering the upper surface of the dummy gate; depositing a dielectric layer on the semiconductor substrate to cover the semiconductor substrate and the upper surface of the second hard mask layer; planarizing the dielectric layer, and removing the second hard mask layer covering the upper surface of the dummy gate, such that an upper surface of the dielectric layer is flush with the upper surface of the dummy gate; removing the dummy gate and depositing a metal gate in the groove structure.

In an embodiment of the manufacturing method, the method further comprises, before depositing the dielectric layer, performing ion implantation in a source region and a drain region on two sides of the dummy gate to form lightly doped drain structures.

In an embodiment of the manufacturing method, the material of the sidewall is the same as that of the dielectric layer.

The present disclosure further provides a semiconductor structure of a metal gate, includes a semiconductor substrate, a sloping sidewall located on the semiconductor substrate and forming a groove structure with an upper surface of the substrate, with the size of an upper part of the groove structure being larger than that of a lower part thereof, and a metal gate located in the groove structure.

In an embodiment of the semiconductor structure, the semiconductor structure further comprises: a dielectric layer formed on the semiconductor substrate, a surface of the dielectric layer being flush with an upper surface of the metal gate.

In an embodiment of the semiconductor structure, the material of the sloping sidewall is the same as that of the dielectric layer.

In an embodiment of the semiconductor structure, the material of the sloping sidewall and the dielectric layer is one or both of silicon nitride and silicon oxide.

In an embodiment of the semiconductor structure, the semiconductor structure further comprises lightly doped drain structures located on two sides of the metal gate.

According to the semiconductor structure of a metal gate and the manufacturing method therefor provided in the present disclosure, a groove structure with an upper opening larger than a lower opening is formed by first forming a sloping sidewall, thereby effectively preventing the creation of the voids while filling and depositing the metal gate in the groove structure, and improving the work performance of the metal gate and the semiconductor device.

BRIEF DESCRIPTION OF THE DRAWINGS

FIGS. 1A-1G show schematic diagrams of a semiconductor structure in a manufacturing process according to an embodiment of the present disclosure.

FIGS. 2A-2J show schematic diagrams of a semiconductor structure in a manufacturing process according to another embodiment of the present disclosure.

DETAILED DESCRIPTION

Figure 2G:
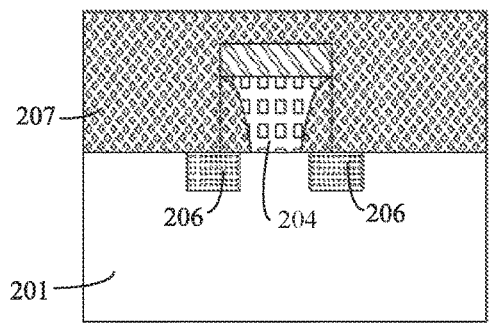

The present disclosure relates to a semiconductor process and device. More specifically, an embodiment of the present disclosure provides a semiconductor device comprising a selective metal gate which is formed in a groove structure with an upper opening larger than a lower opening. By means of the above method, the phenomenon that voids appear during the filling of the metal gate can be effectively reduced, so that the performance of the metal gate and the semiconductor can be further improved. The present disclosure also provides other embodiments.

The reader should notice all documents and literatures which are filed at the same time as this description and which are open to the public for review of this description, the contents of which are incorporated herein by reference. Unless specifically stated otherwise, all features disclosed in this description (including any accompanying claims, abstract and drawings) may be replaced by alternative features for achieving the same, equivalent or similar purpose. Thus, unless expressly stated otherwise, each of the features disclosed is only one example of a group of equivalent or similar features.

Note that in the case of use, the flags left, right, front, rear, top, bottom, forward, backward, clockwise and counter-clockwise, are used only for the purpose of convenience but not imply any specific fixed direction. In fact, they are used to reflect the relative position and/or direction between various parts of an object.

As used herein, the terms "over", "under", "between" and "on" refer to the relative position of this layer relative to the other layers. Likewise, for example, one layer that is deposited or placed over or under another layer may be in direct contact with another layer or may have one or more intervening layers. In addition, one layer that is deposited or placed between layers may be in direct contact with these layers or may have one or more intermediate layers. In contrast, a first layer "on" a second layer is in contact with the second layer. In addition, a relative position of one layer relative to the other layers is provided (assuming that deposition, modification and film removal operations are performed relative to a starting substrate, regardless of the absolute orientation of the substrate).

As described above, according to the semiconductor with a metal structure in the prior art, the metal is not easily deposited into the trench in the process of manufacturing the metal gate, and voids are easily created, so that the metal gate is unreliable and the device performance is degraded. A semiconductor manufacturing method can well deposit a metal gate electrode, so that the interior of the prepared metal gate is less likely to form voids, so as to ensure the reliability of the metal gate and the good device performance of the semiconductor.

FIGS. 1A-1G show simplified diagrams illustrating a process flow for manufacturing a semiconductor with a metal gate in accordance with an embodiment of the present disclosure. These diagrams provide examples only and should not unduly limit the scope of the claims. Depending on the implementation, one or more steps may be added, removed, repeated, rearranged, modified, replaced, and/or overlaid without affecting the scope of protection of the claims.

As shown in FIG. 1A, a semiconductor substrate 101 used in the present disclosure is first provided. The substrate 101 may include: elemental semiconductors including silicon or germanium having a crystalline, polycrystalline or amorphous structure; compound semiconductors including silicon carbide, gallium arsenic, gallium phosphide, indium phosphide, indium arsenide, and indium antimonide; alloy semiconductors including SiGe, GaAsP, AlInAs, AlGaAs, GaInAs, GaInP, and GaInAsP; and any other suitable material, or a combination thereof. In an embodiment, the alloy semiconductor substrate 101 may have a SiGe feature with linearly gradient compositions, in which the compositions of Si and Ge changes from one ratio to another while changing from one position to another. In another embodiment, a SiGe alloy may be formed over the silicon substrate 101. In another embodiment, the SiGe substrate 101 may be strained. In addition, the semiconductor substrate 101 may be a semiconductor on an insulating layer, such as silicon on insulator (SOI) or a thin film transistor (TFT). In some examples, the semiconductor substrate 101 may include a doped epitaxial layer. In other examples, the compound semiconductor substrate 101 may have a multi-layered structure, or the substrate 101 may include a multi-layered compound semiconductor structure.

FIG. 1B shows a process of uniformly depositing a first hard mask layer 102 on an upper surface of the semiconductor substrate 101. The first hard mask layer may be of a dielectric material which may include, for example, oxide, nitride, oxynitride, low-k dielectric materials, ultra low-k dielectric materials, extreme low-k dielectric materials, other dielectric materials, and/or a combination thereof. The above-mentioned deposition process includes, but not limited to, forming the first hard mask layer 102 through chemical vapour deposition (CVD), physical vapour deposition (PVD), atomic layer deposition (ALD), high-density plasma CVD (HDPCVD), metal organic CVD (MOCVD), or plasma enhanced CVD (PECVD).

FIG. 1C shows that in the first hard mask layer 102, corresponding to the region where the metal gate is located, the first hard mask layer is patterned and etched to form the first hard mask layer 102 with a recess. The patterning and etching uses a mask layer (usually a patterned photoresist) to define a surface material region to be etched away. Only a selected portion, i.e. a first hard mask layer 102 corresponding to the region where the metal gate is located in this step of this embodiment, is etched away during etching. The above patterning process may include photoresist coating (e.g., spin coating), soft baking, photomask alignment, exposure, post-exposure baking, photoresist development, rinsing, drying (e.g., hard baking), other suitable processes, and/or a combination thereof.

FIGS. 1D and 1E show schematic diagrams of the semiconductor structure with a sloping sidewall being formed on the semiconductor substrate 101. As shown in FIG. 1D, on the upper surface of the recessed first hard mask layer 102, a dielectric medium 103 is uniformly deposited on a sidewall and the bottom of the recess. The dielectric medium may include, for example, oxide, nitride, oxynitride, low-k dielectric materials, ultra low-k dielectric materials, extreme low-k dielectric materials, other dielectric materials, and/or a combination thereof. The above-mentioned deposition process includes, but not limited to, forming the dielectric medium layer 103 through chemical vapour deposition (CVD), physical vapour deposition (PVD), atomic layer deposition (ALD), high-density plasma CVD (HDPCVD), metal organic CVD (MOCVD), or plasma enhanced CVD (PECVD). As shown in FIG. 1E, after the dielectric medium layer 103 is formed, the dielectric medium layer 103 is etched, and the dielectric medium 103 covering the sidewall of the recess is reserved, thereby forming a sloping sidewall structure.

In an embodiment, the dielectric medium layer is etched by means of dry etching, and the sloping sidewall may be formed on the sidewall of the recess. On each side, the sidewall has a thickness decreasing from the lower surface of the first hard mask layer 102 to the upper surface of the first hard mask layer 102, such that the recess in the sidewall is in the form of a groove structure with an upper opening larger than a lower opening.

FIG. 1F shows a schematic structural diagram of filling metal in the groove structure with the upper opening larger than the lower opening. Since the groove structure filled with the metal has an upper opening greater than a lower opening, the metal gate material is not easily adhered to the opening of the groove structure such that the metal deposition process can be carried out without easily creating voids due to the opening of the groove becoming smaller as the metal is deposited as a result of which the metal is prevented from being deposited into the groove. Therefore, by means of forming a pair of sloping sidewalls shaped with a narrow top and a wide bottom, and forming a groove structure with an upper opening larger than the lower opening between the opposed positions of the pair of sloping sidewalls, it is possible for the metal filler to be injected more smoothly when the metal gate is formed, thereby solving the defects in the prior art that the metal gate has voids due to the reduction of the critical dimensions, and the device performance is not good.

FIG. 1G shows a schematic view of the semiconductor structure after removing the first hard mask layer 102 after forming the metal gate 104. As shown in FIG. 1G, the metal gate structure is formed on the semiconductor substrate 101 and includes sloping sidewalls 103 formed on the semiconductor substrate 101, a groove structure with an upper opening larger than a lower opening and formed by the sloping sidewalls 103 and the upper surface of the substrate 101, and a metal gate 104 formed in the groove structure.

By forming the pair of sloping sidewalls shaped with a narrow top and a wide bottom and forming a groove structure with a larger opening than the lower aperture between the opposed positions of the pair of sloping sidewalls, voids are less likely to be created in the metal gate, thereby improving the performance of the metal gate semiconductor, and ensuring the reliability of the metal gate and good performance of the semiconductor device.

In another embodiment, after forming the sloping sidewalls, before forming the metal gate, a dummy gate is formed, so that processes of source/drain ion implantation and the like can be performed first on the semiconductor structure, the dummy gate is then removed to form the metal gate, and this can reduce the performance impact on the metal gate. FIGS. 2A-2J show the schematic diagram of the semiconductor structure in the above process.

As shown in FIG. 2A, according to the steps shown in FIGS. 1A-1E, a recessed first hard mask layer 202 and sloping sidewalls 203 having a narrower top and a wide bottom are formed on the provided semiconductor substrate 201.

FIG. 2B shows a schematic structural view of depositing a polysilicon layer 204 on the semiconductor. The above-mentioned deposition process includes, but not limited to, forming the polysilicon layer 204 through chemical vapour deposition (CVD), physical vapour deposition (PVD), atomic layer deposition (ALD), high-density plasma CVD (HDPCVD), metal organic CVD (MOCVD), or plasma enhanced CVD (PECVD).

FIG. 2C shows a schematic structural view of the polysilicon layer 204 after planarization. The planarization process is used to remove the polysilicon from the upper surface of the first hard mask layer 202, and to form a dummy gate 204 in a groove structure with an upper opening larger than a lower opening which is formed by the sidewalls 203 and the upper surface of the substrate 201. The planarization process may include a chemical mechanical polishing (CMP) process, a dry etching process, a wet etching process, and/or a combination thereof.

FIG. 2D shows a schematic diagram of depositing a second hard mask layer 205 on the transistor. The second hard mask layer may be of a dielectric material which may include, for example, oxide, nitride, oxynitride, low-k dielectric materials, ultra low-k dielectric materials, extreme low-k dielectric materials, other dielectric materials, and/or a combination thereof. The above-mentioned deposition process includes, but not limited to, forming the second hard mask layer 205 through chemical vapour deposition (CVD), physical vapour deposition (PVD), atomic layer deposition (ALD), high-density plasma CVD (HDPCVD), metal organic CVD (MOCVD), or plasma enhanced CVD (PECVD).

FIG. 2E shows a schematic structural view after the excess part of the first hard mask layer 202 and the excess part of the second hard mask layer 205 are removed from the above-mentioned transistor shown in FIG. 2D. After the excess parts of the first hard mask layer 202 and the second hard mask layer 205 are removed, the upper surface of the substrate 201 reserves the sloping sidewalls 203 and the dummy gate 204 formed in the groove structure with the upper opening larger than the lower opening, and the second hard mask layer 205 covering the sidewalls 203 and the upper surface of the dummy gate 204. The second hard mask layer 205 can protect the sloping sidewalls 203 and the dummy gate 204 in a subsequent process.

FIG. 2F shows a schematic structural diagram of source/drain ion implantation of the transistor. In some embodiments, the N-type source/drain region 206 may have a dopant, such as arsenic (As), phosphorus (P), other group V elements, or a combination thereof. The P-type source/drain region 206 may have a dopant, such as boron (B) or other group III elements. In this embodiment, since the second hard mask layer 205 protects the inclined sidewalls 203 and the upper surface of the dummy gate 204, the performance of the sloping sidewall 203 can be protected from the source/drain ion implantation.

FIG. 2G shows a schematic structural diagram of depositing a dielectric layer 207 on the transistor. The dielectric layer 207 may use, for example, oxide, nitride, oxynitride, low-k dielectric materials, ultra low-k dielectric materials, extreme low-k dielectric materials, other dielectric materials, and/or a combination thereof. The above-mentioned deposition process includes, but not limited to, forming the dielectric layer 207 through chemical vapour deposition (CVD), physical vapour deposition (PVD), atomic layer deposition (ALD), high-density plasma CVD (HDPCVD), metal organic CVD (MOCVD), or plasma enhanced CVD (PECVD). In this embodiment, the material of the dielectric layer is consistent with the material for use in the sidewalls 203, so that the formation of the sidewalls 203 has the least influence on the transistor with a metal gate. In some embodiments, the material of the sidewalls 203 and the material of the dielectric layer may also be different depending on actual requirements of the transistor.

Figure 2H:
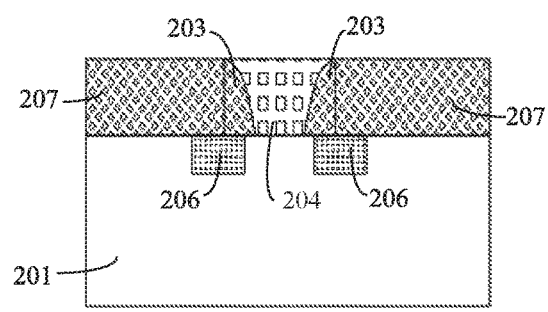

As shown in FIG. 2H, after the dielectric layer 207 is formed, the dielectric layer 207 is planarized to remove the excess part of the dielectric layer 207 and the second hard mask layer 205 formed on the sidewalls 203 and the upper surface of the dummy gate 204, thereby facilitating the subsequent removal of the dummy gate 204. The planarization process may include a chemical mechanical polishing (CMP) process, a dry etching process, a wet etching process, and/or a combination thereof.

Figure 2I:
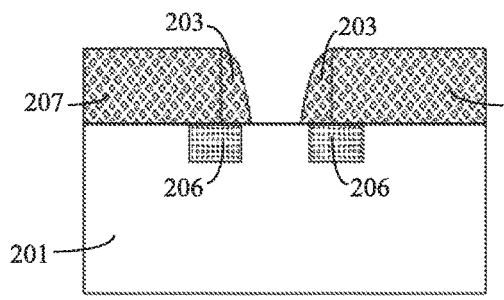

FIG. 2I shows a schematic structural view of removing the dummy gate 204. The removal process may include a wet etching process, a dry etching process, a CMP process, and/or a combination thereof. Since the dummy gate 204 is formed by using a polysilicon material, the dummy gate 204 formed from the polysilicon can be easily removed during the removing step so as to make a preparation for the subsequent formation of the metal gate.

Figure 2J:
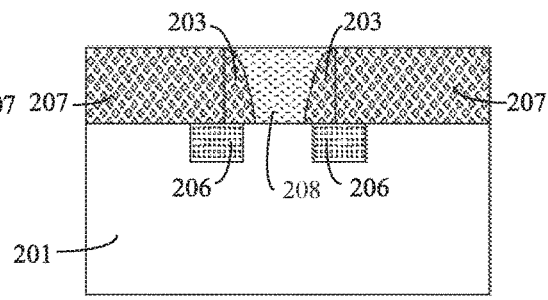

FIG. 2J shows a schematic structural diagram of depositing a metal gate 208 in a groove structure with an upper opening larger than a lower opening after the dummy gate 204 is removed. Since the groove structure filled with the metal has an upper opening greater than a lower opening, the metal gate material is not easily adhered to the opening of the groove structure such that the metal deposition process can be carried out without easily creating voids due to the opening of the groove becoming smaller as the metal is deposited as a result of which the metal is prevented from being deposited into the groove. Therefore, by means of forming a pair of sloping sidewalls shaped with a narrow top and a wide bottom, and forming a groove structure with an upper opening larger than the lower opening between the opposed positions of the pair of sloping sidewalls, it is possible for the metal filler to be injected more smoothly when the metal gate is formed, thereby solving the defects in the prior art that the metal gate has voids due to the reduction of the critical dimensions, and the device performance is not good.

By forming the pair of sidewalls shaped with a narrow top and a wide bottom and forming a groove structure with a larger opening than the lower aperture between the opposed positions of the pair of sidewalls, voids are less likely to be created in the metal gate, thereby improving the performance of the semiconductor with the metal gate, and ensuring the reliability of the metal gate and good performance of the semiconductor device.

As shown in FIG. 2J, the semiconductor structure of a metal gate comprises a semiconductor substrate 201 and sloping sidewalls 203 formed on the substrate 201. The sidewalls 203 and the upper surface of the substrate 201 form a groove structure with an upper opening larger than a lower opening, and a metal gate 208 is formed in the groove structure. The semiconductor structure further comprises a dielectric layer 207 formed on the upper surface of the semiconductor substrate 201. The upper surface of the dielectric layer 207 is flush with the upper surface of the metal gate 208, and in this embodiment, the material of the dielectric layer 207 is the same as that of the sidewalls 203. Therefore, the formation of the sidewalls does not have a significant impact on the performance of subsequent transistor. Furthermore, the above semiconductor structure further comprises lightly doped drain structures 206 located on two sides of the metal gate.

Therefore, embodiments of the method for fabricating a semiconductor structure of a metal gate and the structure thereof have been described. Although the present disclosure has been described with respect to specific exemplary embodiments, it will be apparent that various modifications and changes can be made to these embodiments without departing from the broader spirit and scope of the present disclosure. Accordingly, the description and accompany drawings are to be regarded in an illustrative rather than a restrictive sense.

It is to be understood that this description is not intended to explain or limit the scope or meaning of the claims. In addition, in the foregoing detailed description, it can be seen that various features are combined together in a single embodiment for the purpose of streamlining the present disclosure. This method of the present disclosure should not be interpreted as reflecting the intention that the claimed embodiments require more features than those explicitly recited in each claim. On the contrary, as the following claims reflect, the inventive subject matter involves less than all features of a single disclosed embodiment. Therefore, the claims below are hereby incorporated into the detailed description, with each claim being a separate embodiment on its own.

An embodiment or embodiments mentioned in this description intends that a particular feature, structure, or characteristic described in connection with the embodiment is included in at least one embodiment of the circuit or method. The phrases "an embodiment" appearing in various places in the description do not necessarily all refer to the same embodiment.

What is claimed is:

1. A method for manufacturing a semiconductor structure, the method comprising:

providing a semiconductor substrate;

uniformly depositing a first hard mask layer on the semiconductor substrate;

corresponding to a region where a first metal gate is located, patterning and etching the first hard mask layer to form a recess;

forming a sloping sidewall on a sidewall of the recess, the sloping sidewall and an upper surface of the substrate forming a groove structure, wherein a size of an upper part of the groove structure being larger than a lower part;

forming a second metal gate in the groove structure, wherein the forming of the second metal gate further comprises:

depositing a polysilicon layer on the upper surface of the first hard mask layer and in the groove structure;

planarizing the polysilicon layer to remove polysilicon from the upper surface of the first hard mask layer to form a dummy gate in the groove structure;

depositing a second hard mask layer on the upper surfaces of the first hard mask layer and the dummy gate;

corresponding to a region other than the side wall and the dummy gate, patterning and etching the second hard mask layer and the first hard mask layer, and reserving the sidewall, the dummy gate and the second hard mask layer covering the upper surface of the dummy gate;

depositing a dielectric layer on the semiconductor substrate to cover the semiconductor substrate and the upper surface of the second hard mask layer;

planarizing the dielectric layer, and removing the second hard mask layer covering the upper surface of the dummy gate, such that an upper surface of the dielectric layer is flush with the upper surface of the dummy gate; and removing the dummy gate and depositing a third metal gate in the groove structure; and removing the first hard mask layer.

2. The method of claim 1, wherein the forming of the sloping sidewall on the sidewall of the recess comprises:

uniformly depositing a dielectric medium on an upper surface of the first hard mask layer and the sidewall and the bottom of the recess;

etching the dielectric medium covering the upper surface of the first hard mask layer and the bottom of the recess; and reserving the dielectric medium covering the sidewall of the recess to form the sloping sidewall.

3. The method of claim 1, further comprising:

before depositing the dielectric layer, performing ion implantation in a source region and a drain region on two sides of the dummy gate to form lightly doped drain structures.

4. The method of claim 1, wherein material of the sidewall is the same material as the dielectric layer.

* * * * *

UNITED STATES PATENT AND TRADEMARK OFFICE
CERTIFICATE OF CORRECTION

| | |
|---|---|
| PATENT NO. | : 10,373,834 B2 |
| APPLICATION NO. | : 15/944800 |
| DATED | : August 6, 2019 |
| INVENTOR(S) | : Qiuming Huang |

It is certified that error appears in the above-identified patent and that said Letters Patent is hereby corrected as shown below:

On the Title Page

Item (73), Correct Assignee's name from Shaghai Huali Microelectronics Corporation to Shanghai Huali Microelectronics Corporation.

Signed and Sealed this
Seventh Day of February, 2023

*Katherine Kelly Vidal*

Katherine Kelly Vidal
*Director of the United States Patent and Trademark Office*